United States Patent [19]
Kielmeyer et al.

[11] Patent Number: 5,669,068
[45] Date of Patent: Sep. 16, 1997

[54] COMPLIMENTARY SWITCHED AMPLIFIER TRANSCEIVER SYSTEM

[75] Inventors: Ronald F. Kielmeyer, Tempe; Craig L. Fullerton, Chandler; John D. Goshinska, Gilbert; Hugh R. Malone, Phoenix; Paul L. Brownlee; Richard J. Christensen, both of Mesa; Michael L. Fraser, Tempe, all of Ariz.

[73] Assignee: Motorola, Inc., Schaumburg, Ill.

[21] Appl. No.: 497,835

[22] Filed: Jul. 3, 1995

[51] Int. Cl.⁶ .................................................. H04B 1/44
[52] U.S. Cl. ............................... 455/83; 455/82; 455/129
[58] Field of Search ......................... 455/73, 78, 82, 455/83, 84, 107, 129; 330/51

[56] References Cited

U.S. PATENT DOCUMENTS

| | | | |
|---|---|---|---|
| 5,023,935 | 6/1991 | Vancraeynest | 455/83 |
| 5,220,679 | 6/1993 | Zametzer et al. | 455/82 |
| 5,274,844 | 12/1993 | Harrison et al. | 455/129 |
| 5,296,762 | 3/1994 | Hanson et al. | |
| 5,323,127 | 6/1994 | Komazaki et al. | 455/83 |
| 5,355,524 | 10/1994 | Higgins, Jr. | 455/82 |
| 5,375,257 | 12/1994 | Lampen | 455/83 |
| 5,548,246 | 8/1996 | Yamamoto et al. | 330/51 |

*Primary Examiner*—Reinhard J. Eisenzopf
*Assistant Examiner*—Sam Bhattacharya
*Attorney, Agent, or Firm*—Robert D. Atkins

[57] ABSTRACT

A complimentary switched amplifier transceiver (10) is provided which offers performance advantages and reduces system complexity over conventional half-duplex transceivers by using complimentary switched amplifiers for eliminating switches. Power output to a channel transition (31) from a transmit amplifier (26) is not degraded by a switch insertion loss in a transmit mode. Receiver noise figure is not degraded due to the switch insertion loss from the channel transition (31) to a receive amplifier (27). Switch devices and their associated control lines are eliminated, reducing circuit complexity for complimentary switched amplifier circuits such as a combined amplifier switch (12) and a first bi-directional amplifier (22).

8 Claims, 1 Drawing Sheet

COMPLIMENTARY SWITCHED AMPLIFIER TRANSCEIVER SYSTEM

BACKGROUND OF THE INVENTION

This invention relates in general to half duplex transceiver systems, and more particularly, half duplex transceiver systems making use of complimentary switched amplifiers.

High frequency transceivers, used for half duplex communications applications, commonly make use of a single antenna for both a transmit mode and a receive mode of transceiver operation. A single antenna is appropriate for use in both transmit and receive modes when the frequencies associated with transmit and receive modes are the same or close enough to the same so as to fall within the useful bandwidth of the antenna. Using a single antenna for both transmit and receive functions minimizes the number of antennas required for transceiver operation, and generally results in a physically smaller system than a transceiver using separate antennas for transmit and receive functions.

Use of a single antenna for both transmit and receive modes requires some method of directing RF to the antenna from a transmit path in the transmit mode. Use of a single antenna also requires that the method direct RF to a receive path from the antenna in the receive mode.

The method should also isolate the receive path from the transmit path and the antenna in the transmit mode. Isolating the receive path from the transmit path and the antenna is important during transmit mode when transmit power is directed to the antenna from the transmit path. Transmit power levels can often be high enough to damage sensitive receiver elements, if not sufficiently isolated from the receive path. The method should also isolate the transmit path from the receive path when receive power is directed from the antenna to the receive path. Isolating the transmit path from the receive path prevents the transmit path from loading the receive path, and thus pulling the input impedance seen by the receive path away from an optimal noise impedance.

One common method used to properly direct RF to and from the antenna utilizes a single pole double throw electronic switch which selects either the receive path or the transmit path for coupling with the antenna. An electronic switch can be designed to provide good isolation characteristics to protect the receiver from RF transmit power directed to the antenna. An electronic switch provides isolation by presenting a high impedance in the path from the antenna to the transmitter in receive mode and a high impedance in the path between the antenna and the receiver in transmit mode.

Additional protection of the receiver can be obtained by electronically disabling the receiver through removal of DC bias. This not only protects the sensitive receiver elements, but conserves DC power.

One detrimental effect of inserting a switch between the antenna and both the transmit path and the receive path is that the insertion loss of the switch degrades system performance for both the transmit mode and the receive mode. In transmit mode, the switch loss reduces the actual power available for transmission. The switch loss also limits the amount of power which can be transmitted. Most of the power lost through a switch is absorptive loss, which when transmit power is high, results in excessive heat. In receive mode, the switch loss raises the "noise floor" of the entire receiver and reduces the overall receiver sensitivity.

Along with the performance degradation resulting from placing a switch between the antenna and both the transmit path and the receive path, in integrated circuit form, a switch often utilizes long transmission lines with electrical lengths of significant percentages of a wavelength. The long transmission lines occupy considerable area on an integrated circuit and are thus expensive.

A method of providing half duplex transceiver functions using a single antenna, without the performance degradation effects of switch insertion loss between the antenna and the transmit or receive paths would enhance overall system performance.

DETAILED DESCRIPTION OF THE DRAWINGS

Figure 1:
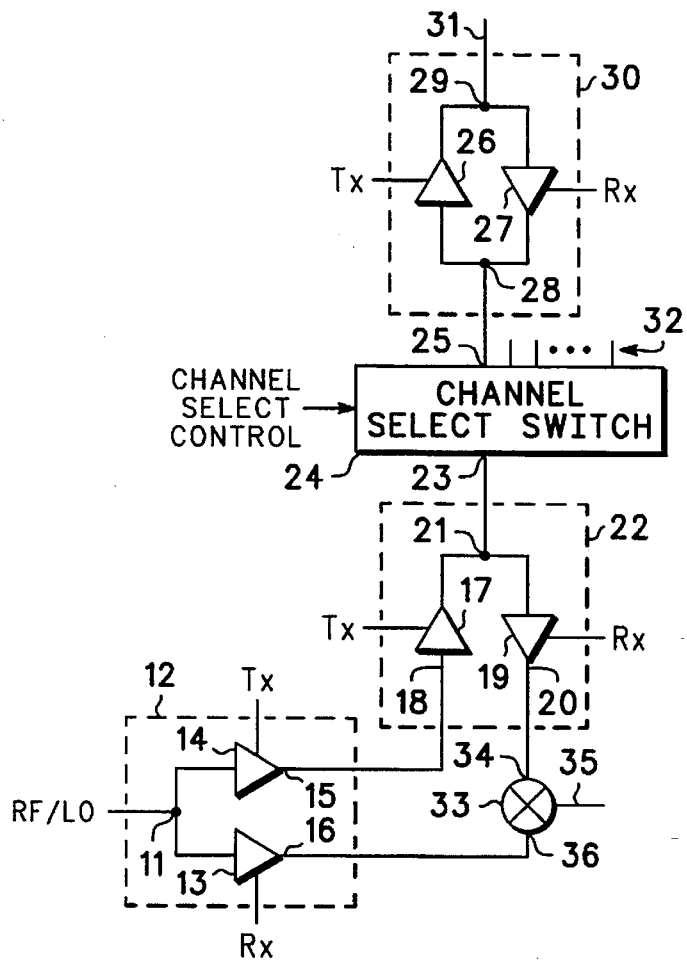
FIG. 1 block diagram of a complimentary switched amplifier transceiver.

Referring to FIG. 1, a complimentary switched amplifier transceiver 10 is shown in block diagram form. Transceiver 10 is suitable for manufacturing using integrated circuits. Transceiver 10 includes a combined amplifier switch 12, and a first bi-directional amplifier 22 with a first bi-directional amplifier input 18 coupled to a first switch output 15. A bi-directional port 21 of first bi-directional amplifier 22 is coupled to a common port 23 of a channel select switch 24. Bi-directional port 21 is coupled to common port 23 of channel select switch 24 if transceiver 10 is to be operated using more than one channel. In single channel operation, bi-directional port 21 of first bi-directional amplifier 22 is coupled to a channel transition of the single channel (not shown) without channel select switch 24.

A first bi-directional port 28 of a second bi-directional amplifier 30 is coupled to a channel select port 25 of channel select switch 24. A channel select control input to channel select switch 24 selects one of multiple channel select ports available to be coupled to common port 23. Channel select switch 24 is a conventional single-pole n-throw bi-directional switch, which may comprise semiconductor electronic switching devices such as transistors or diodes. Common port 23 serves as a pole and channel select port 25 serves as a selected port. Non-selected ports 32 are isolated from common port 23. In practice, channel select switch 24 provides only the number of channel select ports needed for the number of channels used by transceiver 10.

If channel select switch 24 is, for example, a single-pole 6-throw switch, five of the channel select ports of channel select switch 24 would be non-selected ports. Each of one of non-selected ports 32 may be coupled to a bi-directional amplifier (not shown) which is similar to second bi-directional amplifier 30 or a channel transition. A second bi-directional port 29 is coupled to channel transition 31. Channel transition 31 couples transceiver 10 with a communications channel (not shown) appropriate for channel transition 31. Channel transition 31 may be a coaxial transition for a cable channel, an antenna for a radio channel, or any other type of channel transition suitable for RF transmission. Each of the bi-directional amplifiers coupled to non-selected ports 32 of channel select switch 24 are also coupled to a channel transition which is similar to channel transition 31.

A local oscillator (LO) port of a mixer 33 is coupled to a second switch output 16 of combined amplifier switch 12. An RF port 34 of mixer 33 is coupled to a first bi-directional amplifier output 20 of first bi-directional amplifier 22. A common input 11 couples an RF signal from an RF source (not shown) for transmission in transmit mode. Common input 11 couples an LO signal from an LO source (not shown) for frequency conversion in receive mode. An IF port of mixer 33 couples mixer products to a receiver (not shown).

Figure 2:
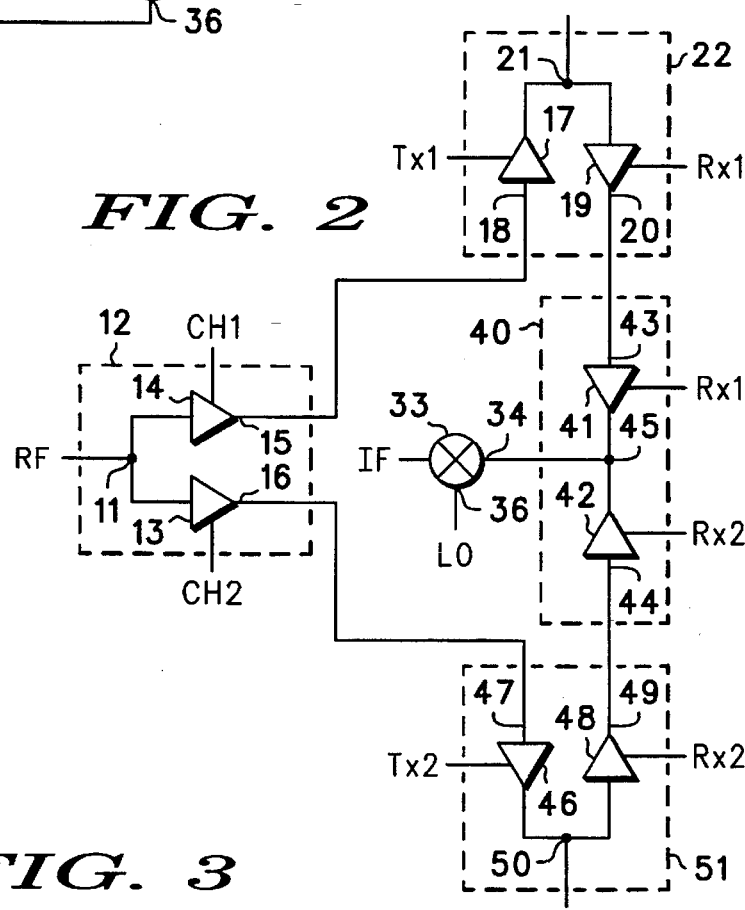
FIG. 2 is a portion of a block diagram of an alternate embodiment of the complimentary switched amplifier transceiver.
Figure 3:
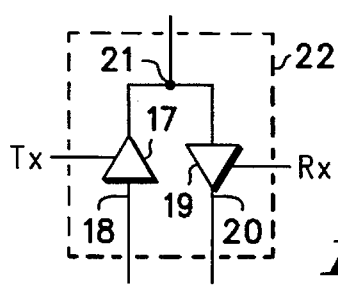
FIG. 3 is a portion of a block diagram of a single channel embodiment of the complimentary switched amplifier transceiver.

A portion of an alternate embodiment of the invention is shown in block diagram form in FIG. 2. FIG. 2 shows only part of the alternate embodiment since circuitry coupled to bi-directional port 21 of first bi-directional amplifier 22 and a common port 50 of an alternate first bi-directional amplifier 51 can be coupled to circuitry similar to bi-directional port 21 of first bi-directional amplifier 22 shown in FIG. 1 or similarly to channel transition 31 as shown in FIG. 3. Components having a similar function are assigned the same reference numbers used in FIG. 1. The alternate embodiment shown in FIG. 2 supports greater flexibility in half-duplex transceiver operation with the addition of alternate first bi-directional amplifier 51 and a combined output amplifier 40. In the embodiment shown in FIG. 2, second output 16 of combined amplifier switch 12 is coupled to alternate first bi-directional amplifier input 47 instead of LO port 36 of mixer 33. A first input 43 and a second input 44 of common output amplifier 40 are coupled respectively, to first bi-directional amplifier output 20 and an alternate first bi-directional amplifier output 49. A common output 45 of combined output amplifier 40 is coupled to RF port 34 of mixer 33.

All amplifiers represented in FIG. 1, FIG. 2 and FIG. 3 are switched amplifiers. A switched amplifier typically operates in a first state and a second state in response to a bias control. A complimentary switched amplifier comprises at least two switched amplifiers providing separate control inputs for controlling bias separately to the switched amplifiers. Switched amplifiers are coupled together typically for the purpose of directing RF energy without use of a separate switch. Where switched amplifiers are coupled together a port is formed. Where opposed switched amplifiers are coupled together such as an input of one switched amplifier coupled to an output of another switched amplifier, a bi-directional port is formed.

A typical application of a complimentary switched amplifier configured with a bi-directional port makes use of one switched amplifier as a transmit amplifier and another switched amplifier as a receive amplifier. For design considerations, it is highly beneficial when a choice is available, to select amplifier devices which when matching networks for the amplifier devices are synthesized, present similar impedance characteristics for the transmit amplifier for a power impedance matched output and the receive amplifier for a noise impedance matched input. Amplifier devices with similar impedance characteristics facilitate coupling the amplifiers together to form the bi-directional port while preserving good matching and performance characteristics.

Where like terminals of switched amplifiers are coupled together, a common port is formed. A common input is formed where inputs of switched amplifiers are coupled together. A common output is formed where outputs of switched amplifiers are coupled together. Coupling switched amplifiers together includes forming matching networks for each of the switched amplifiers allowing the switched amplifiers to operate as impedance matched amplifiers in an on state and impedance mismatched lossy elements in an off state. A complimentary switched amplifier is formed by coupling the switched amplifiers together.

Typically, one switched amplifier is biased in the on state and all other switched amplifiers are biased in the off state. In the on state, a switched amplifier provides insertion gain. In the off state, a switched amplifier provides insertion loss. A complimentary switched amplifier is impedance matched where switched amplifiers are coupled together to form a port, and is impedance matched for the switched amplifier in the on state. Biasing all other switched amplifiers in the off state conserves DC power consumption by minimizing the power consumed by unused devices.

A complimentary switched amplifier is impedance mismatched for a switched amplifier in the off state. Where the switched amplifier in the on state and switched amplifiers in the off state are coupled together, the switched amplifiers in the off state are substantially isolated from the switched amplifier in the on state. The switched amplifiers in the off state are substantially isolated from the switched amplifier in the on state due to the impedance mismatched conditions presented by the switched amplifiers in the off state.

Matching networks must transform input and output impedances of the switched amplifier to substantially match the system impedance when the switched amplifier is in the on state. The matching networks must also transform the input and output impedances of the switched amplifier to an impedance substantially greater than the system impedance so that where the switched amplifier in the on state and the switched amplifier in the off state are coupled together, the high impedance presented by the switched amplifier in the off state substantially removes the switched amplifier in the off state as a parallel load with the switched amplifier in the on state. The complimentary switched amplifiers represented in FIG. 1, FIG. 2, and FIG. 3 are all comprised of pairs of switched amplifiers, but not limited to pairs.

It is to be appreciated that complimentary switched amplifiers are not limited to just two switched amplifiers, but that ideally, complimentary switched amplifier functionality may be expanded with any number of additional switched amplifiers. Practical limitations to the number of additional switched amplifiers include complexity, integrated circuit dimensions, and performance. A complexity limitation is reached when a maximum number of bias controls which control the on or off state of switched amplifiers is reached, and additional switched amplifiers cannot be controlled. Integrated circuit dimensions impose an area limitation to the number of additional switched amplifiers where complimentary switched amplifiers are fabricated by monolithic integrated circuit techniques. A major performance limitation to the number of additional switched amplifiers which can be added to a complimentary switched amplifier is due to imperfections of the switched amplifiers. Switched amplifiers in the off state present small but finite admittance loads in parallel with a switched amplifier in the on state. The admittance loads provide undesired loading conditions for the switched amplifier in the on state. The undesired loading conditions can affect the stability and gain of the switched amplifier in the on state as well as the overall impedance match of the complimentary switched amplifier.

Referring again to FIG. 1, operation of transceiver 10 will be explained in transmit mode. In transmit mode, switched amplifiers with Tx bias control inputs are biased in the on state. Furthermore, in transmit mode, switched amplifiers with Rx bias control inputs are biased in the off state. Second switch amplifier 13 is biased in an off state and first switch amplifier 14 is biased in an on state. First switch amplifier 14 provides gain which amplifies the RF signal from common input 11 to a first switch output 15 coupled to first bi-directional amplifier input 18. Second switch amplifier 13 is substantially isolated from common input 11 and first switch amplifier 14 due to the off state of second switch amplifier 13.

A feature of the invention is the use of a complimentary switched amplifier for combined amplifier switch 12 to eliminate a switch and reduce system complexity. Combined amplifier switch 12 combines the function of a unidirectional single-pole-double-throw (SPDT) switch with amplification, thus eliminating the need for a separate switch (not shown) at common input 11. Eliminating the need for a separate switch reduces the number of switch devices and associated elements, and conserves expensive chip area when fabricated as a semiconductor integrated circuit (IC). Eliminating the need for a separate SPDT switch also reduces the complexity of system DC control by eliminating the separate control inputs for a switch. Common versions of SPDT switches often require two complimentary DC control inputs to control four switch devices.

An additional feature of combined amplifier switch 12 is provided through operation of the switched amplifiers in other than strictly on or off states. Both first switch amplifier 14 and second switch amplifier 13 may be operated using bias inputs which cause first switch amplifier 14 and second switch amplifier 13 to provide gain from common input 11 respectively, to first switch output 15 and second switch output 16. Providing gain from first switch amplifier 14 and second switch amplifier 13 allows combined amplifier switch 12 to operate as an active power splitter. Operating combined amplifier switch 12 as an active power splitter requires that the matching networks for first switch amplifier 14 and second switch amplifier 13 be designed such that when coupled together to form common input 11, the input impedance of common input 11 substantially matches the system impedance.

Operating combined amplifier switch 12 as an active power splitter has both functional and space saving benefits. Conventional power splitters typically contribute insertion loss from a power splitter input to any of power splitter outputs. Combined amplifier switch 12 operated as an active power splitter can contribute insertion gain. Conventional power splitters typically involve use of quarter wavelength transmission lines which occupy substantial area. Combined amplifier switch 12 may be designed to occupy only approximately the area required of devices used to form first switch amplifier 14 and second switch amplifier 13.

In the alternate embodiment shown in FIG. 2, an RF signal from a signal generator (not shown) is coupled to common input 11 of combined amplifier switch 12. First switch amplifier 14 and second switch amplifier 13 use channel 1 (Ch. 1) and channel 2 (Ch. 2) inputs to control operation of combined amplifier switch 12. Using Ch. 1 and Ch. 2 to control bias to combined amplifier switch 12 allows combined amplifier switch 12 to behave as a switch with gain or an active power splitter. It is to be appreciated that additional channels can be added by coupling inputs of additional switched amplifiers to common input 11, the additional switched amplifiers each having channel bias inputs controlling the additional switched amplifiers independently from others.

Referring again to FIG. 1, in transmit mode input amplifier 17 of first bi-directional amplifier 22 is in an on state, and output amplifier 19 is in an off state. Input amplifier 17 provides gain which further amplifies the RF signal from first bi-directional amplifier input 18 to bi-directional port 21. Output amplifier 19 in the off state is substantially isolated from input amplifier 17 and bi-directional port 21 due to the off state of output amplifier 19.

With reference to FIG. 2, in transmit mode with Ch. 1 input biasing first switch amplifier 14 in an on state, and Ch. 2 biasing second switch amplifier 13 in an off state, the alternate embodiment operates as the embodiment shown in FIG. 1. With Ch. 2 input biasing second switch amplifier 13 in the on state, alternate first bi-directional amplifier 51 operates in a similar manner to first bi-directional amplifier 22 with bias control Tx1 corresponding to bias control Tx in FIG. 1. Referring again to FIG. 2, the operations of alternate input amplifier 46 and alternate output amplifier 49 correspond to input amplifier 17 and output amplifier 19, respectively with bias controls Tx2 corresponding to Tx1 and Rx2 corresponding to Rx1. With Ch. 1 input and Ch. 2 input biasing both first and second switch amplifiers 14 and 13 in the on state, combined amplifier switch 12 behaves as an active power splitter coupling RF to both first bi-directional amplifier 22 and alternate first bi-directional amplifier 51. It is to be appreciated that additional bi-directional amplifiers similar to first bi-directional amplifier 22 may be added in conjunction with additional channels added to combined amplifier switch 12 as previously discussed.

An alternate embodiment of the invention is partially shown in FIG. 3. Partial representation is shown because components coupled to first bi-directional amplifier input 18 and first bi-directional amplifier output 20 may be similar to those represented in FIG. 1 or FIG. 2. Channel transition 31 is coupled to bi-directional port 21 without channel select switch 24. Input amplifier 17 serves as a transmitter for the RF signal being transmitted to a channel from channel transition 31. Bi-directional port 21 eliminates the need for a TR switch. Eliminating the need for a TR switch at bi-directional port 21 is important to reduce the amount of output power demanded of from transmitter to satisfy the power requirement for transmission to the channel transition. Without bi-directional port 21, TR switch insertion loss would increase the power required of the transmitter only to be dissipated as heat by the TR switch.

In the embodiment of the invention shown in FIG. 1, the RF signal from bi-directional port 21 is coupled to channel select port 25. In transmit mode, transmit amplifier 26 of second bi-directional amplifier 30 is in the on state and receive amplifier 27 is in the off state. Transmit amplifier 26 amplifies the RF signal from first bi-directional port 28 to second bi-directional port 29. The amplified RF signal is coupled to channel transition 31 from second bi-directional port 29. Receive amplifier 27 in the off state is substantially isolated from first bi-directional port 28, transmit amplifier 26, and second bi-directional port 29 due to the off state of receive amplifier 27.

An input load impedance presented by receive amplifier 27 in the off state does not significantly affect an output impedance presented to transmit amplifier 26. Substantially isolating the input impedance of receive amplifier 27 in the off state from the output impedance presented to transmit amplifier 26 in transmit mode prevents pulling the output load impedance presented to transmit amplifier 26 away from the impedance intended for power amplifier operation of transmit amplifier 26. It is to be appreciated that additional switched amplifiers with separate bias control inputs similar to transmit amplifier 26 may be coupled in parallel with transmit amplifier 26 to provide different amplifier characteristics during transmit mode.

Selecting a channel transition such as channel transition 31 also includes selecting the appropriate complimentary switched amplifier pair such as second bi-directional amplifier 30. Selecting second bi-directional amplifier 30 in transmit mode allows transmit amplifier 26 to be biased to an on state, and receive amplifier 27 is biased to an off state. Selecting second bi-directional amplifier 30 in a receive mode allows receive amplifier 27 to be biased to an on state, and transmit amplifier 26 is biased to an off state. All other complimentary switched amplifier pairs coupled to non-selected ports 32 of channel select switch 24 are biased to off states. Biasing complimentary switched amplifiers coupled to unselected channel transitions not only improves isolation between selected and un-selected channels, but also conserves DC power.

In receive mode, the switched amplifiers with Rx bias control inputs are biased in the on state and the switched amplifiers with Tx bias control inputs are biased in the off state. In receive mode, receive amplifier 27 is biased in the on state, and received RF coupled from channel transition 31 is amplified from second bi-directional port 29 to first bi-directional port 28. It is to be appreciated, that additional switched amplifiers with separate bias control inputs similar to receive amplifier 27 may be coupled in parallel with receive amplifier 27 to provide different amplifier characteristics during receive mode. Transmit amplifier 26 in the off state is substantially isolated from second bi-directional port 29, receive amplifier 27 and first bi-directional port 28 due to the off state of transmit amplifier 26. An output impedance presented by transmit amplifier 26 does not affect the input impedance presented to receive amplifier 27.

Substantially isolating the output impedance of transmit amplifier 26 in the off state from the input impedance presented to receive amplifier 26 in receive mode prevents pulling the input load impedance presented to receive amplifier 27 away from the impedance intended for low noise amplifier operation of receive amplifier 27.

A half duplex transceiver using a single channel transition for input RF and output RF requires that the channel transition be coupled to both a receiver and a transmitter. A half duplex transceiver operates in either a transmit mode or a receive mode but not both. A feature of the present invention eliminates the performance degrading effects of a transmit/receive (TR) switch between a channel transition and a transmitter or receiver by eliminating the TR switch. The method of eliminating the TR switch replaces the TR switch with complimentary switched amplifiers. Further system improvements such as lower complexity and better reliability are obtained by eliminating switches elsewhere within the system by using complimentary switched amplifiers.

Second bi-directional port 29 provides an important performance improvement over the conventional use of a TR switch. Receive amplifier 27 is typically a low noise amplifier designed to have a low noise figure. With a conventional TR switch, the insertion loss of the TR switch preceding receive amplifier 27 contributes directly to the noise figure of receive amplifier 27 thus degrading system noise figure directly. Eliminating the TR switch and thus the TR switch insertion loss by using second bi-directional port 29 improves system noise figure.

The method of using a complimentary switched amplifier, such as the complimentary switched amplifier formed by coupling transmit amplifier 26 and receive amplifier 27 together to form bi-directional port 29, provides benefits in both transmit mode and receive mode. In transmit mode, transmit power is not dissipated by a switch. Eliminating the switch allows transmit amplifier 26 to be designed as a lower power amplifier, which typically simplifies power amplifier design and heat removal problems. In receive mode, eliminating the switch enhances the system noise figure.

Referring to FIG. 1, in receive mode, the received RF is coupled from first bi-directional port 28 of second bi-directional amplifier 30 to channel select port 25. Channel select switch 24 couples the received RF from channel select port 25 to common port 23. A benefit of using first bi-directional port 28 of second bi-directional amplifier 30 results from reduced complexity. If transmit amplifier 26 and receive amplifier 27 were not coupled together to form first bi-directional port 28, then the complexity of channel select switch 24 would have to be doubled to couple received RF to common port 23. Replacing first bi-directional port 28 with a switch would add complexity in the form of additional control inputs for the switch. Received RF is coupled from common port 23 of channel select switch 24 to bi-directional port 21 of first bi-directional amplifier 22.

In the alternate embodiment shown in FIG. 3, in which only a single channel transition is used, and channel select switch 24 is not used, received RF from channel transition 31 would be coupled to bi-directional port 21 of first bi-directional amplifier 22. Bi-directional port 21 would serve the same purpose and provide the same benefits as described above for second bi-directional port 29 of second bi-directional amplifier 30. Output amplifier 19 in the on state serves as a receive amplifier, and input amplifier 17 in the off state is substantially isolated from bi-directional port 21 and output amplifier 19.

Referring to the FIG. 1, the received RF is coupled from first bi-directional port 28 of second bi-directional amplifier 30 to channel select port 25 of channel select switch 24. Channel select switch 24 couples the received RF from channel select port 25 to common port 23. The received RF is coupled from common port 23 of channel select switch 24 to bi-directional port 21 of first bi-directional amplifier 22. Output amplifier 19 in the on state amplifies the received RF from bi-directional port 21 to first bi-directional output 20. Input amplifier 17 in the off state is substantially isolated from bi-directional port 21 and output amplifier 19.

In receive mode an LO signal from an LO generator (not shown) is coupled to common input 11 of combined amplifier switch 12. Second switch amplifier 13 in the on state of combined amplifier switch 12 amplifies the LO signal from common input 11 to second switch output 16. First switch amplifier 14 is substantially isolated from common input 11 and second switch amplifier 13. The LO signal is coupled from second switch output 16 to LO port 36 of mixer 33. Received RF is coupled from first bi-directional output 20 of first bi-directional amplifier 22 to RF port 34 of mixer 33. Mixer 33 produces mixer products of the received RF and the LO signal available at IF port 35.

In the alternate embodiment shown in FIG. 2, an LO signal from an LO generator (not shown) is coupled to LO port 36 of mixer 33. In receive mode, bias control Rx1 biases output amplifier 19 in an on state so that output amplifier 19 amplifies received RF from bi-directional port 21 to first bi-directional output 20. Tx1 bias control biases input amplifier 17 in an off state which substantially isolates input amplifier 17 from bi-directional port 21. With bias control Rx1 biasing first combined output amplifier 41 in an on state, RF coupled from first bi-directional output 20 of first bi-directional amplifier 22 is amplified from first input 43 to common output 45 of combined output amplifier 40. Alternate first bi-directional amplifier 51 operates in a similar manner to first bi-directional amplifier 22 with alternate input amplifier 46 corresponding to input amplifier 17, alternate output amplifier 48 corresponding to output amplifier 19, bias control Tx2 corresponding to bias control Tx1 and bias control Rx2 corresponding to bias control Rx1.

Bias control Rx2 should not be permitted to bias amplifiers in on states when bias control Rx1 biases amplifiers in on states or vice versa. Allowing the condition of both bias controls Rx1 and Rx2 to bias amplifiers in on states would combine received signals from first directional amplifier 22 and alternate first bi-directional amplifier 51 at common output 45 to be coupled to RF input 34 of mixer 33.

A feature of the alternate embodiment allows operation in several modes. In a first mode, bias controls Ch. 1 and Rx1 permit first bi-directional amplifier 22 and combined output amplifier 40 to receive RF and bias controls Ch. 2 and Rx2 inhibit alternate first bi-directional amplifier from receiving RF. In a second mode, bias controls Tx1 and Tx2 permit transmission of RF from both first bi-directional amplifier 22 and alternate bi-directional amplifier 51 when bias controls Ch. 1 and Ch. 2 allow combined amplifier switch to function as an active power splitter. In a third mode of operation bias controls Ch. 1 and Tx1 allow transmission from first bi-directional amplifier 22 and bias controls Ch. 2 and Tx2 inhibit transmission from alternate bi-directional amplifier 51.

In a fourth mode, conditions of the second mode apply and Rx2 allows reception of RF by alternate first bi-directional amplifier 51 simultaneously with transmission of RF by first bi-directional amplifier 22. The fourth mode should only be permitted when sufficient isolation exists between respective channels associated with first bi-directional amplifier 22 and alternate first bi-directional amplifier 51. The fourth mode allows the alternate embodiment to behave as two half-duplex transceivers which when combined, provide full duplex capability. Additional modes are possible as conditions recited for the first mode, the third mode, and the fourth mode substitute Tx1 for Tx2, Rx1 for Rx2, Ch. 1 for Ch. 2, and alternate first bi-directional amplifier 51 for first bi-directional amplifier 22. Altogether, seven modes are possible. It is to be appreciated that additional inputs from additional channels may be directed to RF port 34 of mixer 33 if outputs of additional switched amplifiers with separate Rx bias controls similar to first and second combined output amplifiers 41 and 42 are coupled to common output 45. Inputs to additional amplifiers having outputs coupled to common output 45 can come from additional channels.

The method of achieving half duplex transceiver operation in a system having a channel transition can be seen as comprising the steps of selecting the channel transition and substantially isolating in a transmit mode, a receive amplifier from the channel transition and a transmit amplifier coupled to the channel transition. The isolation of the receive amplifier is achieved without a switch by biasing the receive amplifier in an off state In a receive mode, the transmit amplifier is substantially isolated from the channel transition and the receive amplifier without a switch by biasing the transmit amplifier in an off state.

By now, it should be appreciated that a half-duplex transceiver using complimentary switched amplifiers as in complimentary switched amplifier transceiver 10 provides performance advantages and reduces system complexity by eliminating switches. Power output to channel transition 31 from transmit amplifier 26 is not degraded by the insertion loss of a switch in transmit mode. Receiver noise figure is not degraded due to the insertion loss of a switch from channel transition 31 to receive amplifier 27. Switch devices and their associated control lines are eliminated, reducing circuit complexity for complimentary switched amplifier circuits such as combined amplifier switch 12. Elimination of switches also reduces area requirements normally associated with integrated circuit switch designs which typically include long transmission line elements.

We claim:

1. A complimentary switched amplifier transceiver, comprising:

a combined amplifier switch;

a first bi-directional amplifier having a first bi-directional amplifier input coupled to a first switch output of the combined amplifier switch;

a channel select switch having a common port coupled to a bi-directional port of the first bi-directional amplifier;

a second bi-directional amplifier having a first bi-directional port coupled to a channel select port of the channel select switch;

a channel transition coupled to a second bi-directional port of the second bi-directional amplifier; and a mixer having an RF port coupled to a first bi-directional amplifier output, and an LO port coupled to a second switch output of the combined amplifier switch;

wherein each of the first and second bi-directional amplifiers has a first mode where a transmitter amplifier thereof is biased in an ON state while a receiver amplifier thereof is biased in an OFF state and a second mode where the transmitter amplifier thereof is biased in an OFF state while the receive amplifier thereof is biased in an ON state.

2. The complimentary switched amplifier transceiver of claim 1 wherein the combined amplifier switch includes:

a first switch amplifier having an output coupled to the first switch output, operating in first and second states in response to a bias control; and a second switch amplifier having an input coupled to an input of the first switch amplifier to form a common input and an output coupled to the second switch output, operating in first and second states in response to a bias control.

3. The complimentary switched amplifier transceiver of claim 1 wherein the first bi-directional amplifier further includes:

an input amplifier having an input coupled to the first bi-directional amplifier input, operating in first and second states in response to a bias control; and an output amplifier having an input coupled to an output of the input amplifier to form the bi-directional port and an output coupled to the first bi-directional amplifier output, operating in first and second states in response to a bias control.

4. The complimentary switched amplifier transceiver of claim 1 wherein the second bi-directional amplifier includes:

a transmit amplifier operating in first and second states in response to a bias control; and a receive amplifier having an output coupled to an input of the transmit amplifier to form a first bi-directional port, an input coupled to an output of the transmit amplifier, operating in first and second states in response to a bias control.

5. A method achieving half-duplex transceiver operation in a system having a channel transition comprising the steps of:

selecting the channel transition which includes a selection of a complimentary switched amplifier pair having the transmit amplifier and the receive amplifier coupled to the channel transition;

isolating in a transmit mode a receive amplifier coupled to the channel transition from the channel transition and a transmit amplifier coupled to the channel transition and biasing the transmit amplifier to an off state wherein an output load impedance presented by the transmit amplifier does not affect an input impedance of the receive amplifier in the receive mode; and isolating in a receive mode a transmit amplifier coupled to the channel transition from the channel transition and the receive amplifier coupled to the channel transition.

6. The method of claim 5 wherein isolating the receive amplifier further includes biasing the receive amplifier to an off state wherein an input load impedance presented by the receive amplifier does not affect an output impedance of the transmit amplifier in the transmit mode.

7. A method of providing a complimentary switched amplifier comprising the steps of:

coupling an output of a transmit amplifier with an input of a receive amplifier;

coupling an input of the receive amplifier with an output of the transmit amplifier;

biasing the transmit amplifier in an ON state and the receive amplifier in an OFF state in a first mode;

biasing the transmit amplifier in an ON state and the receive amplifier in an OFF state in a second mode; and coupling the transmit amplifier and the receive amplifier with a channel transition through a common bi-directional port without any isolation element there between.

8. An amplifier comprising:

a bi-directional complimentary switch amplifier transceiver having a transmit amplifier and a receive amplifier;

a uni-directional complimentary switch amplifier transceiver, having a transmit amplifier and a receive amplifier, wherein an output of the transmit amplifier of the uni-directional complimentary switch amplifier transceiver is coupled to an input of the transmit amplifier of the bi-directional complimentary switch amplifier transceiver;

a mixer coupled between the uni-directional complimentary switch amplifier transceiver and the bi-directional complimentary switch amplifier transceiver and coupled to an output of the receive amplifier of the uni-directional complimentary switch amplifier and coupled to an output of the receive amplifier of the bi-directional complimentary switch amplifier.

\* \* \* \* \*